United States Patent
Belotserkovsky

(10) Patent No.: US 7,894,333 B2
(45) Date of Patent: Feb. 22, 2011

(54) METHOD AND APPARATUS FOR USE IN CARRIER RECOVERY IN A COMMUNICATIONS SYSTEM

(75) Inventor: Maxim B. Belotserkovsky, Carmel, IN (US)

(73) Assignee: Thomson Licensing, Boulogne, Billancourt (FR)

( * ) Notice: Subject to any disclaimer, the term of this patent is extended or adjusted under 35 U.S.C. 154(b) by 746 days.

(21) Appl. No.: 10/593,882

(22) PCT Filed: Mar. 22, 2004

(86) PCT No.: PCT/US2004/008743

§ 371 (c)(1),
(2), (4) Date: Sep. 21, 2006

(87) PCT Pub. No.: WO2005/096578

PCT Pub. Date: Oct. 13, 2005

(65) Prior Publication Data

US 2007/0189195 A1    Aug. 16, 2007

(51) Int. Cl.
*H03D 3/24* (2006.01)
(52) U.S. Cl. .................... 370/216; 375/376
(58) Field of Classification Search .............. 370/310, 370/216, 221–224, 315; 375/316, 322, 324, 375/327, 375, 376
See application file for complete search history.

(56) References Cited

U.S. PATENT DOCUMENTS

| | | | |
|---|---|---|---|
| 4,297,650 A * | 10/1981 | Shinmyo | 331/11 |
| 4,987,386 A | 1/1991 | Poklemba et al. | |
| 5,471,508 A * | 11/1995 | Koslov | 375/344 |
| 5,490,176 A * | 2/1996 | Peltier | 375/325 |
| 5,841,323 A | 11/1998 | Fujimoto | |
| 6,151,368 A * | 11/2000 | Cochran | 375/326 |
| 6,298,100 B1 | 10/2001 | Bouillet | |
| 6,947,497 B1 * | 9/2005 | Ahn | 375/326 |

(Continued)

FOREIGN PATENT DOCUMENTS

JP    10-107623    4/1998

(Continued)

OTHER PUBLICATIONS

Matzner et al., "A Digital Transmission System Using Quaternary Partial Response CPM Principle Structure and Measurement Results", Proceedings of the International Conference on Communicaions (ICC). Geneva, May 23-26, 1993, New York, IEEE, US, vol. vol. 3, May 23, 1993, pp. 732-736.*

(Continued)

*Primary Examiner* — Derrick W Ferris
*Assistant Examiner* — Omar Ghowrwal
(74) *Attorney, Agent, or Firm* — Robert D. Shedd; Joseph J. Opalach

(57) ABSTRACT

A receiver includes a digital phase locked loop (PLL) for performing carrier recovery. The digital PLL further includes a phase error estimator driven by hard decisions and an integrator, which accumulates a phase error signal provided by the phase error estimator. To reduce the acquisition time, the digital PLL is run in an open-loop mode during which an estimate of the carrier frequency offset is determined as a function of the phase error signal. After the estimate of the carrier frequency offset is determined, the integrator is preloaded with the determined estimate and the digital PLL is run in a closed-loop mode.

7 Claims, 9 Drawing Sheets

U.S. PATENT DOCUMENTS

2002/0067778 A1* 6/2002 Ahn .......................... 375/326
2002/0122511 A1* 9/2002 Kwentus et al. ............. 375/343
2003/0137765 A1   7/2003 Yamazaki et al.

FOREIGN PATENT DOCUMENTS

| JP | 2001-168931 | 6/2001 |
|---|---|---|
| JP | 2002-185314 | 6/2002 |

OTHER PUBLICATIONS

Search Report dated Dec. 20, 2004.
Matzner R et al.: "A Digital Tranmission System Using Quaternary Partial Response CPM: Principle Structure and Measurement Results" Proceedings of the International Conference on Communications (ICC), Geneva, May 23-26, 1993, New York, IEEE, US, vol. 3, May 23, 1993, pp. 732-736.

* cited by examiner

METHOD AND APPARATUS FOR USE IN CARRIER RECOVERY IN A COMMUNICATIONS SYSTEM

This application claims the benefit, under 35 U.S.C. §365 of International Application PCT/US2004/008743, filed Mar. 22, 2004, which was published in accordance with PCT Article 21(2) on Oct. 13, 2005 in English.

BACKGROUND OF THE INVENTION

The present invention generally relates to communications systems and, more particularly, to carrier recovery in a communications system.

A carrier recovery loop, or carrier tracking loop, is a typical component of a communications system. The carrier recovery loop is a form of phase locked loop (PLL). In a digital carrier recovery loop, a decision-directed error estimator is often used to drive the PLL. In other words, the loop is driven by hard decisions, e.g., phase errors between respective received signal points and sliced symbols (nearest symbols) taken from the symbol constellation. When the carrier frequency offset, i.e., the frequency difference between the carrier of the received signal and the recovered carrier, is outside the "lock range" of the loop, the so-called "pull-in" process occurs, in which, under proper operating conditions, the loop operates to reduce the carrier frequency offset until the carrier frequency offset falls inside the lock range of the loop and phase lock follows.

For the correct pull-in process to take place, it is necessary that the output signal of the error estimator have a bias such that an integrator of the PLL drifts in the desired direction, i.e., a direction that reduces the carrier frequency offset. Unfortunately, there will be instances when the aforementioned bias will have an incorrect sign (because of excessive delay through the loop, errors associated with fixed point arithmetic, etc.), which, over time, will result in the loop either drifting without any predictable pattern or stabilizing at a false value (a "false-lock" condition). To combat this problem it is common to increase the precision of the arithmetic operations performed in the loop and/or to increase the loop gain. However, when the root cause of the problem lies in the pipeline delay through the loop and when such delay is necessitated by the system architecture and, thus, is unchangeable, the only option commonly available is to try and reduce the effective carrier frequency offset presented at an input to the loop such that the delay through the loop is no longer harmful. This can be done by sub-dividing the overall carrier frequency offset range into smaller ranges though which the loop can be "stepped". However, the latter solution unavoidably increases the overall loop acquisition time and may not even be feasible if no reliable loop lock criterion exists to control the stepping algorithm.

SUMMARY OF THE INVENTION

As noted above, when a PLL of a receiver is operating outside the lock range, acquisition time may increase or may not be feasible. However, I have observed that it is possible to reduce the acquisition time in a way that adds little hardware and/or software overhead to the receiver. In particular, and in accordance with the principles of the invention, a receiver determines a carrier frequency offset estimate as a function of a phase error signal of the PLL.

In an embodiment of the invention, a receiver includes a digital phase locked loop (PLL) for performing carrier recovery. The digital PLL further includes a phase error estimator driven by hard decisions and an integrator, which accumulates a phase error signal provided by the phase error estimator. To reduce the acquisition time, or to make acquisition possible, the digital PLL is run in an open-loop mode during which an estimate of the carrier frequency offset is determined as a function of the phase error signal. After the estimate of the carrier frequency offset is determined, the integrator is pre-loaded with the determined estimate and the digital PLL is run in a closed-loop mode, whereby acquisition time is reduced.

DETAILED DESCRIPTION

Other than the inventive concept, the elements shown in the figures are well known and will not be described in detail. For example, other than the inventive concept, set-top box, and the components thereof, such as a front-end, Hilbert filter, carrier tracking loop, video processor, remote control, etc., are well known and not described in detail herein. In addition, the inventive concept may be implemented using conventional programming techniques, which, as such, will not be described herein. Finally, like-numbers on the figures represent similar elements.

Figure 1:
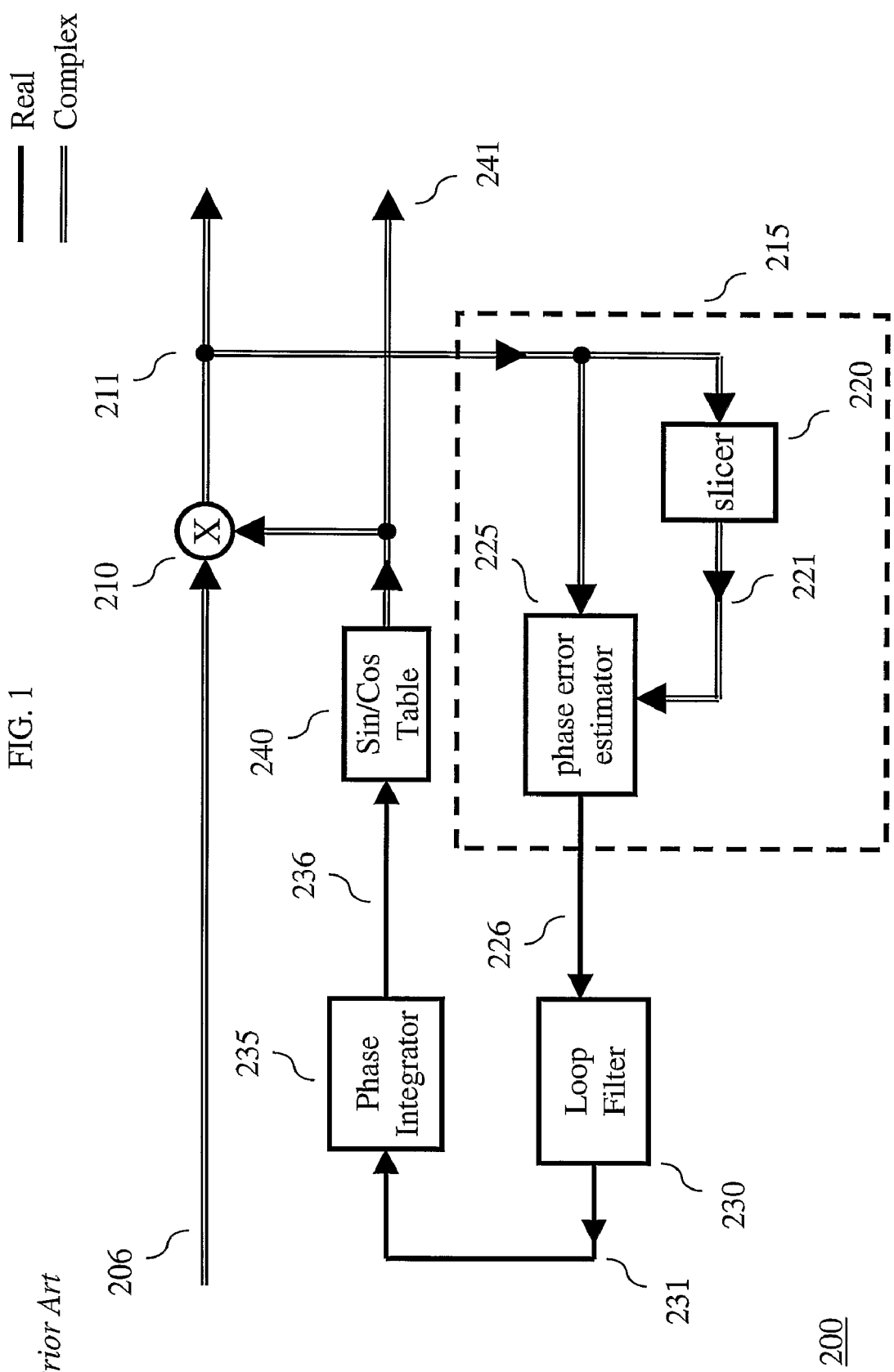
FIG. 1 illustrates a prior art carrier recovery circuit.

Before describing the inventive concept, attention should be directed to FIG. 1, which shows a prior art carrier recovery circuit 200 for use in a receiver (not shown) for an illustrative received signal 206 modulated at a carrier frequency, $f_c$. It should be noted that received signal 206 may be the result of other processing (not shown) in the receiver, e.g., downconversion, band-pass filtering, etc. Further, it is assumed that received signal 206, and the processing illustrated by FIG. 1, is in the digital domain (although this may not be required), i.e., the carrier recovery circuit 200 includes a digital phase-locked loop (DPLL) driven by hard decisions. Carrier recovery circuit 200 includes complex multiplier 210, phase error detector 215, loop filter 230, phase integrator 235 and sine/cosine (sin/cos) table 240. The received signal 206 is a complex sample stream comprising in-phase (I) and quadrature (Q) components. It should be noted that complex signal paths are specifically shown as double lines in FIG. 1. Complex multiplier 210 receives the complex sample stream of received signal 206 and performs de-rotation of the complex sample stream by recovered carrier signal 241. In particular, the in-phase and quadrature components of received signal 206 are rotated by a phase of recovered carrier signal 241, which represents particular sine and cosine values provided by sin/cos table 240. The output signal from complex multiplier 210 is a down-converted received signal 211, e.g., at baseband, and represents a de-rotated complex sample stream of received signal points. As can be observed from FIG. 1, down-converted received signal 211 is also applied to phase error detector 215, which computes any phase offset still present in the down-converted signal 211 and provides a detector output signal 226 indicative thereof (also referred to herein as a phase error signal). The detector output signal 226 is applied to loop filter 230, which filters the detector output signal 226 to provide a filtered signal 231 that is applied to phase integrator 235. The latter is also referred to as a numerically controlled oscillator (NCO). Phase integrator 235 further integrates filtered signal 231 and provides an output phase angle signal 236 to sin/cos table 240, which, as noted above, provides the associated sine and cosine values to complex multiplier 210 for de-rotation of received signal 206 to provide down-converted received signal 211.

It should be noted that phase error detector 215 includes two elements phase error estimator 225 and slicer 220. As known in the art, the latter makes a hard decision as to the possible symbol (target symbol) represented by the in-phase and quadrature components of each received signal point of down-converted signal 211. In particular, for each received signal point of down-converted signal 211, slicer 220 selects the closest symbol (target symbol) from a predefined constellation of symbols. As such, the detector output signal 226 provided by phase error estimator 225 represents the phase difference between each received signal point and the corresponding target symbol. In particular, detector output signal 226 represents a sequence of phase error estimates, α, where each particular α is determined by calculating the imaginary part of the received signal point times the conjugate of the associated sliced symbol, i.e., $$\alpha \approx \mathrm{imag}(z \cdot z^*_{sliced}) = |z| \cdot |z_{sliced}| \sin(\angle z - \angle z_{sliced}). \quad (1)$$

In the above equation, Z represents the complex vector of the received signal point, $z_{sliced}$ represents the complex vector of the associated sliced signal point and $z^*_{sliced}$ represents the conjugate of the complex vector of the associated sliced signal point.

Figure 2:
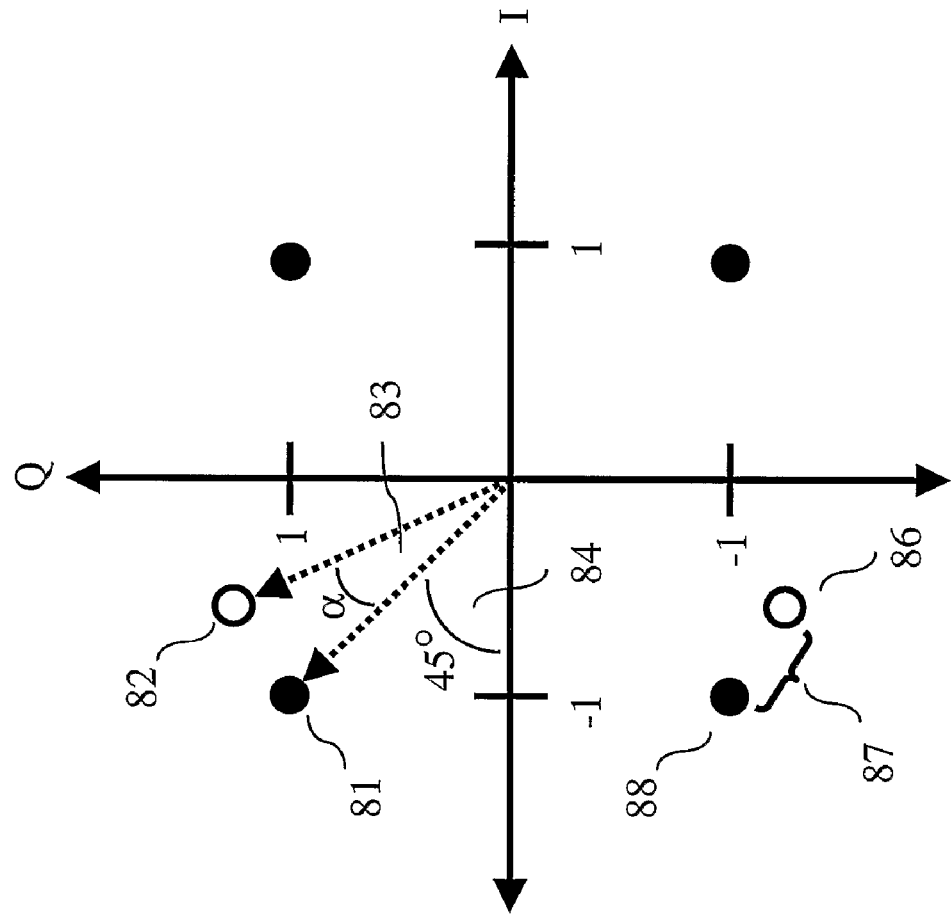
FIG. 2 illustrates a prior art hard decision process with respect to a received signal point and a constellation space having four symbols.

For example, consider a quadrature phase-shift keying (QPSK) symbol constellation 89 shown in FIG. 2. The latter has four symbols located in a complex plane at in-phase (I) and quadrature (Q) coordinates (1, 1), (1, −1), (−1, −1) and (−1, 1). A transmitted symbol 81 of value (−1, 1) may have noise added by the channel such that the value of the received signal point at a receiver is, e.g., (−0.6, 1.2), as represented by received signal point 82. In the receiver, slicer 220 makes hard decisions as to the transmitted symbol by simply selecting that symbol of the constellation closest to the received signal point as the received, or target, symbol. In this example, slicer 220 would select symbol 81 (−1, 1) as the received symbol. As can be observed from FIG. 2, a phase error 83 (i.e., α) exists between the received signal point and the target symbol. This phase error, α, is representative of "decision directed phase error detection" and phase error detector 215 provides a detector output signal 226 proportional to α for driving carrier recovery loop 200.

In the context of the illustrative symbol constellation 89, the phase error, α, is a monotonic function and varies between +/−45 degrees since the hard decision process always assumes that a received signal point is a phase-rotated version of a symbol from the same quadrant. However, it can be observed from FIG. 2 that the phase error, α, can be ambiguous if a received signal point is actually in a different quadrant from the actual transmitted symbol. For example, consider received signal point 86 of FIG. 2. In this case, slicer 220 will select symbol 88 of value (−1, −1) as the transmitted symbol and the associated phase error, α, is represented by the angular difference 87 even if the actual transmitted symbol was symbol 81. In other words, once the actual phase error exceeds +/−45 degrees, the assumed transmitted symbol changes.

Figure 3:
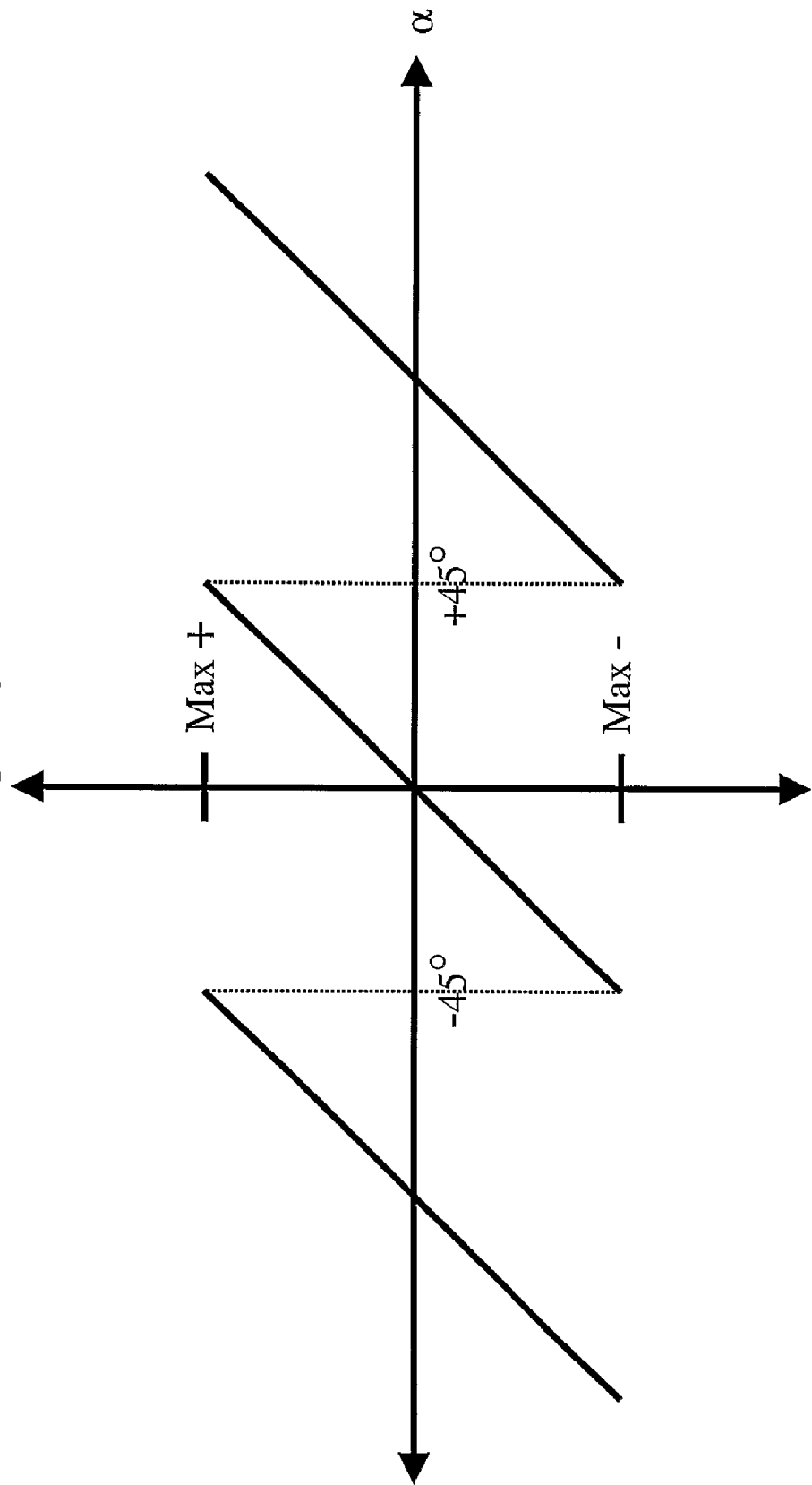
FIG. 3 illustrates a phase detector output signal.

In view of the above noted phase error ambiguity, I have observed that if the received signal points are rotating (due to a carrier frequency offset) and the carrier recovery loop is "opened," the phase error, α, will linearly increase (or decrease) and the detector output signal will "rollover" from a max positive (+) value to a max negative (−), and vice versa. Hence, in an open loop mode of operation, the detector output signal 226 will have a "saw tooth" shape as illustrated in FIG. 3, where the "saw tooth" frequency is linearly proportional to the carrier frequency offset. In particular, if the average number of times the detector output signal goes from max (+) to max (−) (or vice versa) per unit of time (a natural choice for the time unit would be the received symbol period) is measured, the resulting number, after proper scaling, will be close to (or, in an ideal case, equal to) the carrier frequency offset value that phase integrator 235 would need to hold in order to perfectly cancel the carrier frequency offset at the input to carrier recovery loop 200. This appropriately scaled number can be loaded into phase integrator 235 and carrier recovery loop 200 can then be put into the closed mode to correct for any possible residual carrier frequency offset. As such, when the carrier recovery loop is operating outside the lock range, it is possible to reduce the acquisition time in a way that adds little hardware and/or software overhead to the receiver. In particular, and in accordance with the principles of the invention, a receiver performs a carrier frequency offset estimate as a function of a phase error signal of the carrier recovery loop.

Figure 4:
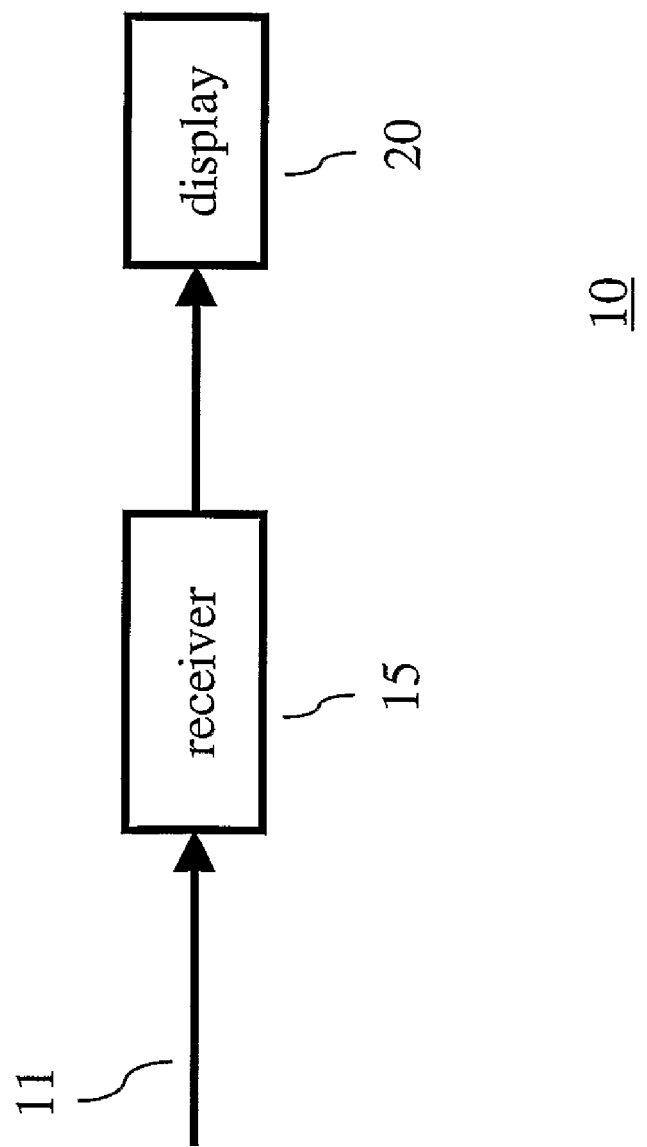
FIG. 4 shows an illustrative high-level block diagram of a portion of a cable system embodying the principles of the invention.

A high-level block diagram of a portion of an illustrative cable system 10 in accordance with the principles of the invention is shown in FIG. 4. Cable system 10 includes a set-top box 15 (also referred to herein as receiver 15) and a display 20 (e.g., a television set). Illustratively, receiver 15 is a digital cable receiver. Receiver 15 receives a cable signal 11 (e.g., via an antenna or cable-drop (not shown)) for processing to recover therefrom, e.g., an HDTV (high definition TV) video signal for application to display 20 for viewing video content thereon.

Figure 5:
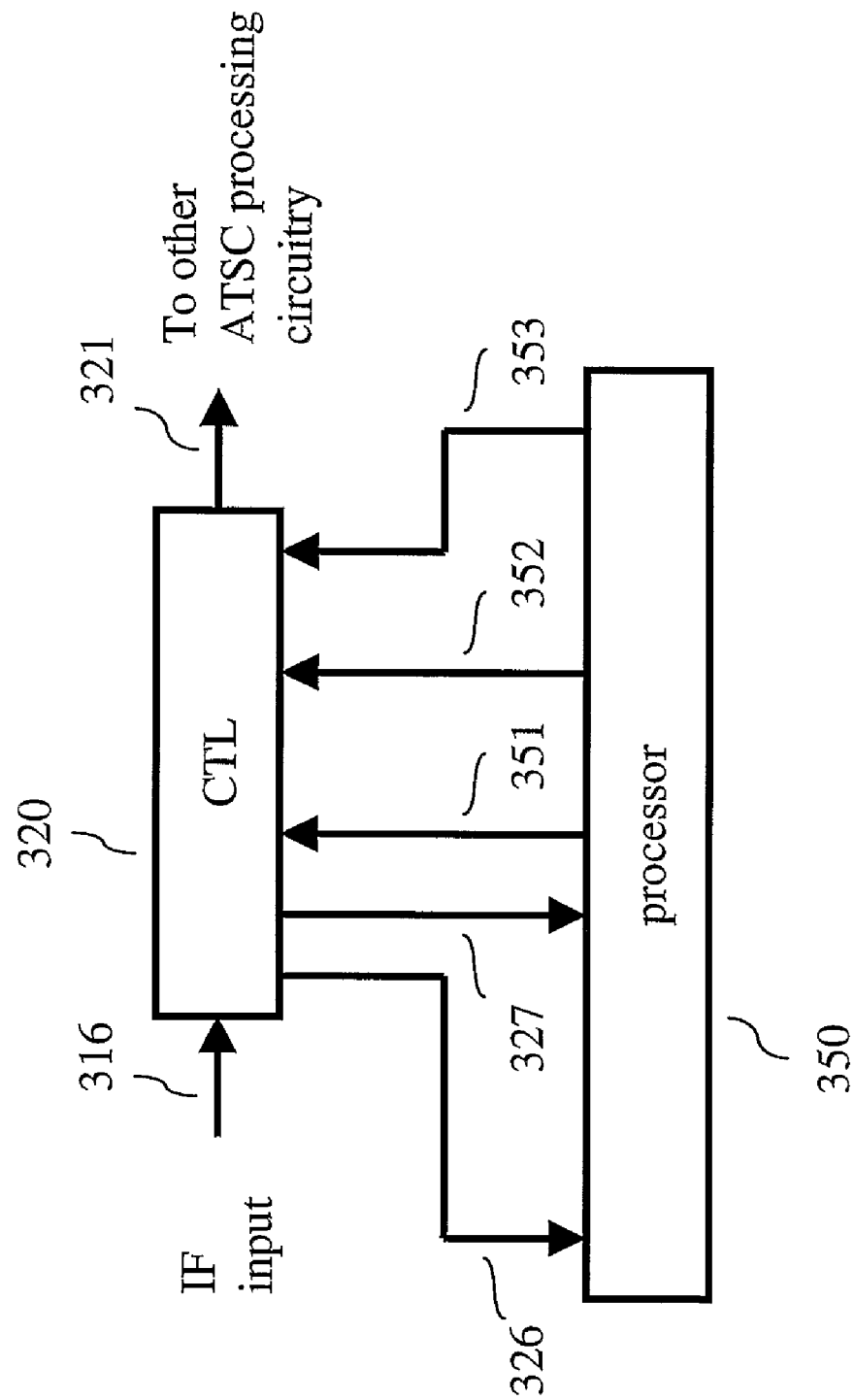
FIG. 5 shows a portion of a receiver embodying the principles of the invention for use in the cable system of FIG. 4.

Turning now to FIG. 5, that relevant portion of receiver 15 in accordance with the principles of the invention is shown. In particular, receiver 15 includes carrier tracking loop (CTL) 320 and processor 350. The latter is a stored-program-controlled processor, e.g., a microprocessor, which executes a program, or programs, stored in a memory (now shown), which may be internal and/or external to processor 350.

Input signal 316 represents a QPSK modulated signal centered at a specific IF (Intermediate Frequency) of $F_{IF}$ Hertz. Input signal 316 is passed through CTL 320, which, in accordance with the principles of the invention, processes signal 316 to down convert the IF signal to baseband and correct for frequency offsets between the transmitter (not shown) and the receiver tuner Local Oscillator (not shown). CTL 320 is a second order loop, which, in theory, allows for frequency offsets to be tracked with no phase error. In practice, phase error is a function of the loop bandwidth, input phase noise, thermal noise and implementation constraints like bit size of the data, integrators and gain multipliers. CTL 320 provides a down-converted received signal 321. The latter is provided to other portions (not shown) of receiver 15 for recovery of the data conveyed therein.

In accordance with the principles of the invention, receiver 15 performs an open-loop carrier frequency offset estimate as a function of a phase error signal of CTL 320. Illustratively, and as described further below, processor 350 is coupled with CTL 320 via signals 326, 327, 351, 352 and 353 for determining the aforementioned carrier frequency offset estimate and, responsive thereto, loading CTL 320 with this estimate—thus reducing acquisition time of CTL 320.

Figure 6:
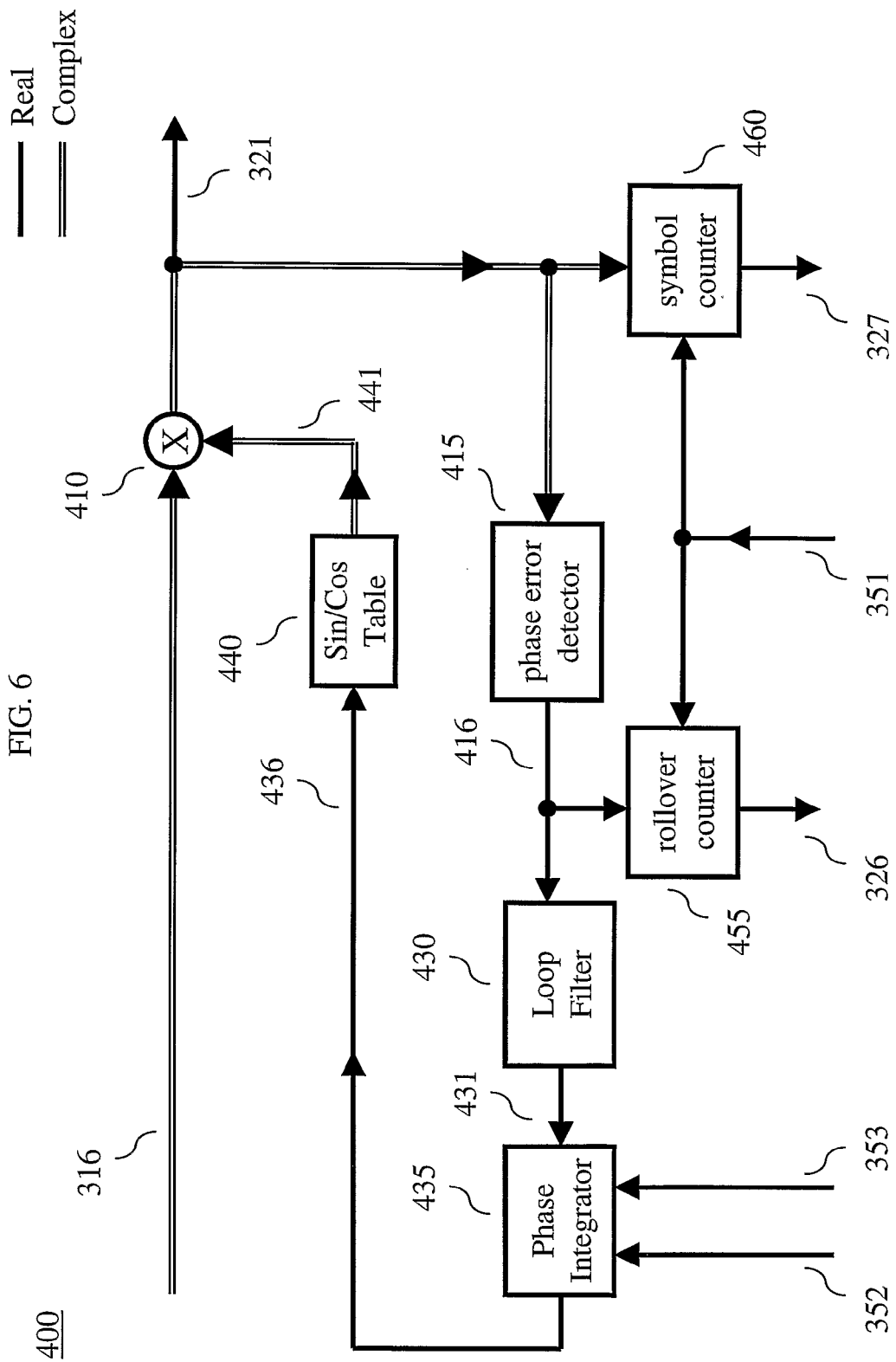
FIG. 6 shows an illustrative carrier tracking loop in accordance with the principles of the invention for use in the receiver of FIG. 5.

Turning now to FIG. 6, an illustrative embodiment of CTL 320 is shown in accordance with the principles of the invention. Other than the inventive concept, CTL 320 is a digital PLL driven by hard decisions. CTL 320 includes complex multiplier 410, phase error detector 415, loop filter 430, phase integrator 435, sine/cosine (sin/cos) table 440, rollover counter 455 and symbol counter 460. It is assumed that the elements of CTL 320 are running at the received symbol rate, e.g., $1/T_{SYMBOL}$, where $T_{SYMBOL}$ is equal to a symbol period. However, the inventive concept is not so limited. Further, it is assumed that the received signal 316 is a complex sample stream comprising in-phase (I) and quadrature (Q) components. It should be noted that complex signal paths are specifically shown as double lines in FIG. 6. If received signal 316 is not already a complex sample stream, a Hilbert filter (not shown) can be used to recover the (Q) component of received signal 316. CTL 320 has two modes of operation: an open loop mode of operation and a closed loop mode of operation. As described further below, CTL 320 is run in the open loop mode of operation to determine an estimate of the carrier frequency offset. Once this estimate is determined, CTL 320 is loaded with this estimate and then run in the closed loop mode for easy, and quick, correction of any residual carrier frequency offset.

Figure 7:
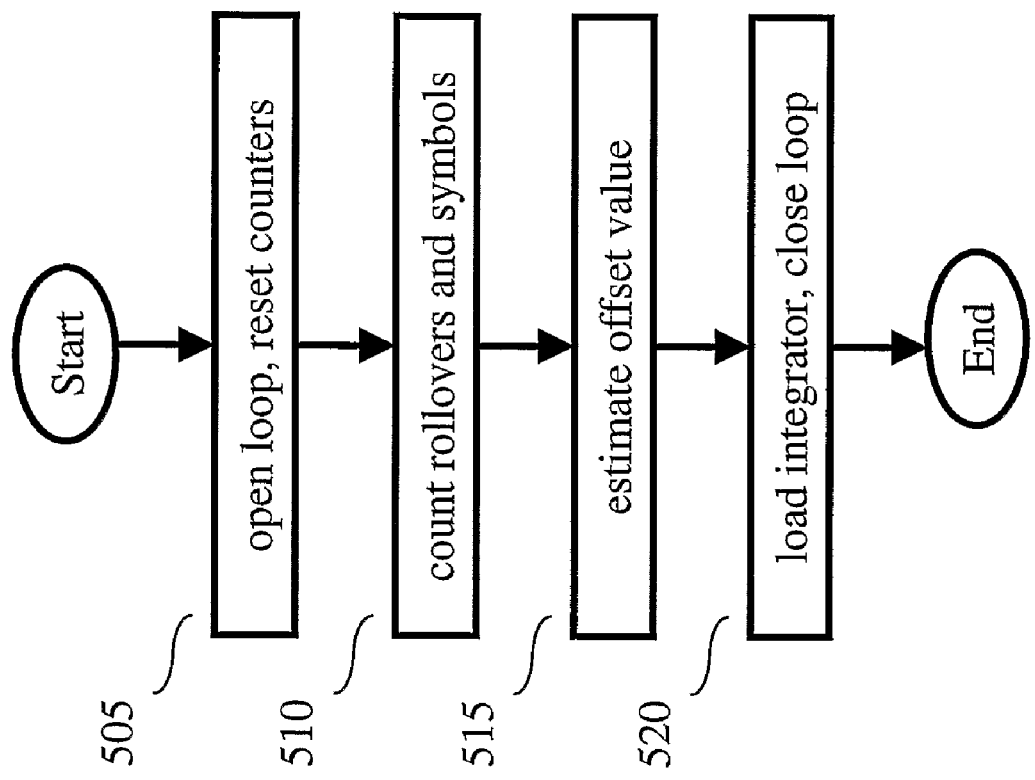
FIGS. 7 and 8 show illustrative flow charts in accordance with the principles of the invention.

At this time reference should also be made to FIG. 7, which shows an illustrative flow chart in accordance with the principles of the invention for use in receiver 15. In step 505, processor 350 sets CTL 320 to an open loop mode of operation. For example, processor 350 controls phase integrator 435 via signal 352 such that filtered signal 431 is disregarded and output phase angle signal 436 is generated with respect to a predetermined constant reference phase. Additionally in step 505, processor 350 clears, or resets, rollover counter 455 and symbol counter 460 via signal 351. In step 510, processor 350 enables rollover counter 455 and symbol counter 460, e.g., via signal 351, to begin counting. Rollover counter 455 counts the number of times detector output signal 416 rolls over. Symbol counter 460 counts the number of symbols received during operation of rollover counter 455. In step 515, processor 350 retrieves the values from rollover counter 455 and symbol counter 460 via signals 326 and 327, respectively. For example, processor 350 performs step 515 after expiration of a predetermined period of time, $T_{COUNT}$, or upon symbol counter 460 reaching a predetermined value, etc. Preferably, the number of received symbols counted by symbol counter 460 is large enough to ensure good averaging since random rollovers are possible in noisy conditions. From the rollover counter and symbol counter values, processor 350 determines, in accordance with the inventive concept, an estimate of the carrier frequency offset (offset value) in step 515. For example, if the number of bits in phase integrator 435 is N, then the equation to calculate the offset value is:

$$\text{offsetvalue} = \text{rollovercounter} \div (\text{symbolcounter} \times 4) \times 2^N; \quad (2)$$

where the term "rollovercounter" is equal to the value of rollover counter 455 and the term "symbolcounter" is equal to the value of symbol counter 460. The factor of "4" in equation (2) comes from the fact that the rollover counter in the QPSK case will rollover 4 times per single period of the offset frequency. It should be noted that if the value of symbolcounter is a power of two then, advantageously, the division operation of equation (2) can be replaced with an equivalent bit shift operation. In step 520, processor 350 loads (or initializes, or updates) phase integrator 435, via signal 353, with the offset value and sets CTL 320 to a closed loop mode of operation, via signal 352.

The closed loop mode of operation of CTL 320, other than the inventive concept, is similar to the earlier described carrier recovery circuit 200 of FIG. 1. Complex multiplier 410 receives the complex sample stream of received signal 316 and performs de-rotation of the complex sample stream by recovered carrier signal 341. In particular, the in-phase and quadrature components of received signal 316 are rotated by a phase of recovered carrier signal 341, which represents particular sine and cosine values provided by sin/cos table 340. The output signal from complex multiplier 410 is a down-converted received signal 321, e.g., at baseband, and represents a de-rotated complex sample stream of received signal points. Down-converted received signal 321 is also applied to phase error detector 415, which computes (e.g., using the above-described equation (1)) any phase offset still present in the down-converted signal 321 and provides a detector output signal 416 indicative thereof (also referred to herein as a phase error signal). The detector output signal 416 is applied to loop filter 430, which filters the detector output signal 416 to provide a filtered signal 431 that is applied to phase integrator 435. The latter, now preloaded with an estimate for the carrier frequency offset, further integrates filtered signal 431 and provides an output phase angle signal 436 to sin/cos table 440, which, as noted above, provides the associated sine and cosine values to complex multiplier 410 for de-rotation of received signal 316 to provide down-converted received signal 321.

As described above, and in accordance with the principles of the invention, a receiver performs an open-loop carrier frequency offset estimate as a function of a phase error signal of the carrier recovery loop. After the estimate of the carrier frequency offset is determined, the receiver initializes, or updates, the carrier recovery loop with the determined estimate and then runs the carrier recovery loop in a closed-loop mode, whereby acquisition time is reduced.

In addition to reduction of the acquisition time when a loop is operating outside the lock range, other applications of the inventive concept are possible. For example, the above-described determination of a carrier frequency offset estimate as a function of a phase error signal can also be used to decide whether a loop is in a true, or false, lock state. This is illustrated in the flow chart of FIG. 8, which may be performed periodically, or aperiodically (e.g., in response to a predetermined condition). In step 550, processor 350 reads the closed loop phase integrator value (e.g., available from phase integrator 435). In step 555, processor 350 sets CTL 320 to an open loop mode of operation, as described above, and clears, or resets, rollover counter 455 and symbol counter 460 via signal 351. In step 560, processor 350 enables rollover counter 455 and symbol counter 460, e.g., via signal 351, to begin counting. In step 565, processor 350 estimates the open loop offset value, as described above. In step 570, processor 350 compares the closed loop value read in step 550 with the estimated open loop value of step 565. If the difference between the closed loop value and the open loop value satisfies one, or more, predetermined conditions, then a "false lock" is declared and processor 350 executes a false lock routine in step 575. For example, processor 350 may simply load phase integrator 435, via signal 353, with the estimated offset value and set CTL 320 to a closed loop mode of operation. In addition, a false lock may require processor 350 to initialize, flush, or reset other circuitry and/or buffers as known in the art. However, if no "false lock" is declared in step 570, then a "lock" condition exists and processor 350 executes a lock routine in step 580. For example, processor 350 simply sets CTL 320 to a closed loop mode of operation. With respect to step 570, any one, or more, conditions can be used to determine whether CTL 320 is in a false lock state. For example, in step 570 processor 350 compares the closed loop phase integrator value read in step 550 to the estimated open loop offset value. If the values have the same sign and are within an order of magnitude, then it is presumed that CTL 320 is locked, otherwise is in a false lock state.

Figure 8:
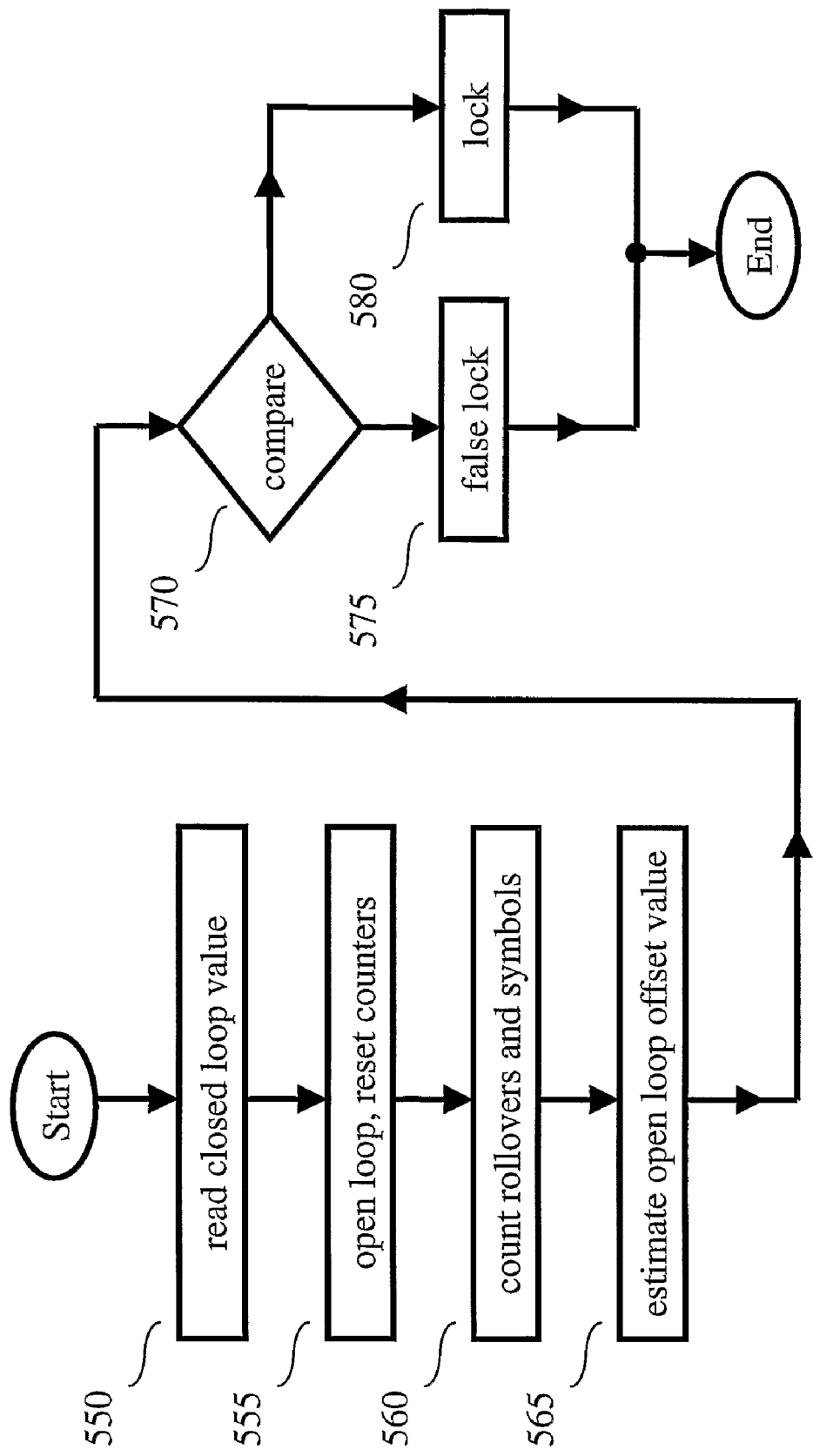
Figure 9:
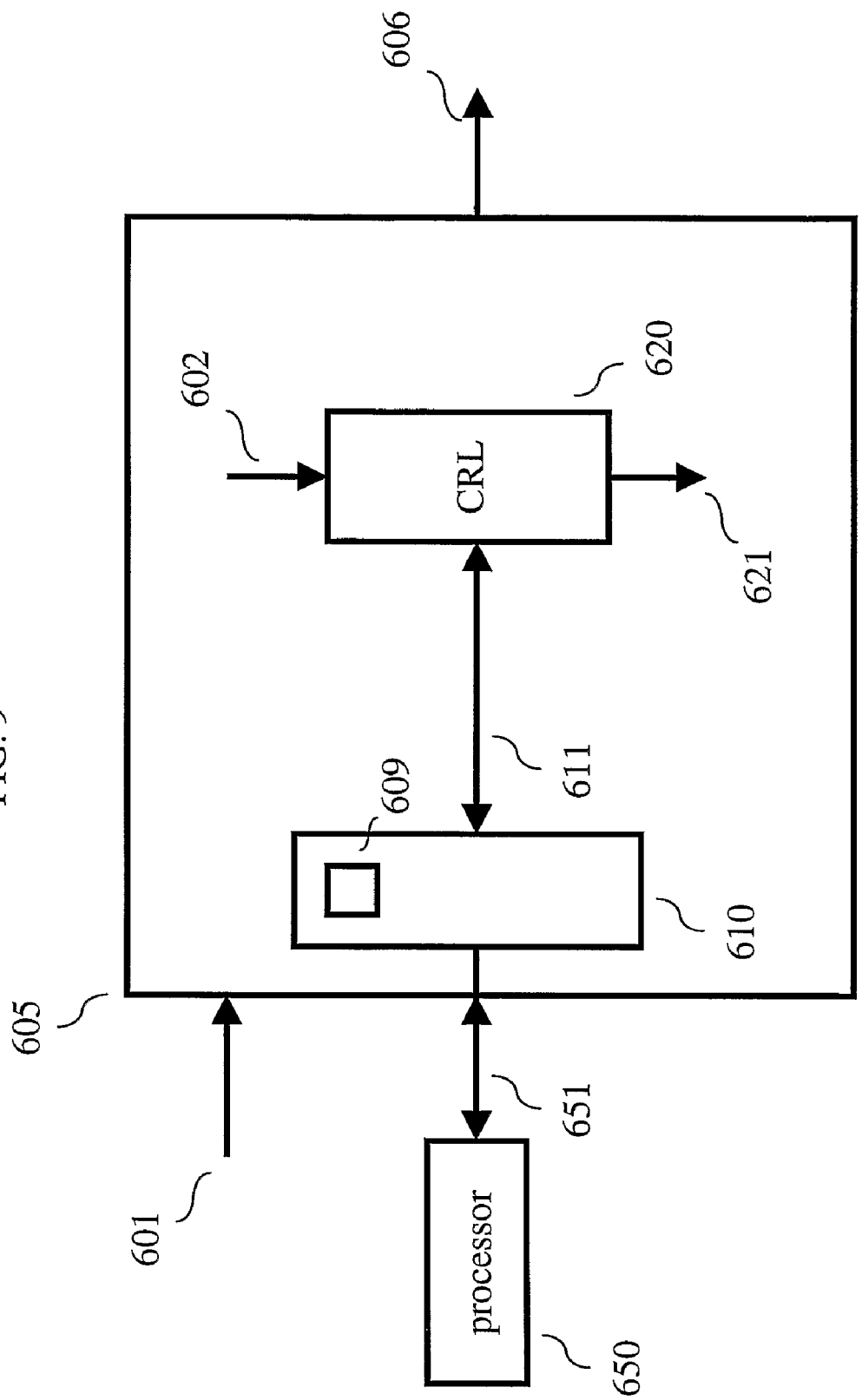
FIG. 9 shows another illustrative embodiment in accordance with the principles of the invention.

Another illustrative embodiment of the inventive concept is shown in FIG. 9. In this illustrative embodiment an integrated circuit (IC) 605 for use in a receiver (not shown) includes a carrier recovery loop (CRL) 620 and at least one register 610, which is coupled to bus 651. Illustratively, IC 605 is an integrated analog/digital television decoder. However, only those portions of IC 605 relevant to the inventive concept are shown. For example, analog-digital converters, filters, decoders, etc., are not shown for simplicity. Bus 651 provides communication to, and from, other components of the receiver as represented by processor 650. Register 610 is representative of one, or more, registers, of IC 605, where each register comprises one, or more, bits as represented by bit 609. The registers, or portions thereof, of IC 605 may be read-only, write-only or read/write. In accordance with the principles of the invention, CRL 620 includes the above-described carrier frequency offset estimation feature, or operating mode, and at least one bit, e.g., bit 609 of register 610, is a programmable bit that can be set by, e.g., processor 650, for enabling or disabling this operating mode. In the context of FIG. 8, IC 605 receives an IF signal 601 for processing via an input pin, or lead, of IC 605. A derivative of this signal, 602, is applied to CRL 620 for carrier recovery as described above. CRL 620 provides signal 621, which is a derotated version of signal 602. CRL 620 is coupled to register 610 via internal bus 611, which is representative of other signal paths and/or components of IC 605 for interfacing CRL 620 to register 610 as known in the art (e.g., to read the earlier-described integrator and counter values). IC 605 provides one, or more, recovered signals, e.g., a composite video signal, as represented by signal 606. Although not shown in FIG. 8, values of the above-described rollover counter and symbol counter (or their equivalents) may be available via one, or more, of the registers. Alternatively, IC 605 may include all of the above-described processing for determining an estimate of the carrier frequency offset as a function of a phase error signal, with the operating mode simply being enabled, or disabled via bit 610. However, it should be noted the inventive concept is not so limited and external control of this operating mode, e.g., via bit 610, is not required.

In view of the above, the foregoing merely illustrates the principles of the invention and it will thus be appreciated that those skilled in the art will be able to devise numerous alternative arrangements which, although not explicitly described herein, embody the principles of the invention and are within its spirit and scope. For example, although illustrated in the context of separate functional elements, these functional elements may be embodied on one or more integrated circuits (ICs). Similarly, although shown as separate elements, any or all of the elements may be implemented in a stored-program-controlled processor, e.g., a digital signal processor, which executes associated software, e.g., corresponding to one or more of the steps shown in FIGS. 7 and 8. Further, although shown as discrete elements in FIG. 4, the elements therein may be distributed in different units in any combination thereof. For example, receiver 15 of FIG. 4 may be a part of a television set, video board of a personal computer etc. Also it should be noted that although the phase error signal of the PLL was illustratively averaged, other statistical functions may be used along with respective modifications to, e.g., equation (2). It is therefore to be understood that numerous modifications may be made to the illustrative embodiments and that other arrangements may be devised without departing from the spirit and scope of the present invention as defined by the appended claims.

The invention claimed is:

1. A method for use in a receiver, the method comprising: using the receiver to perform the steps of
   processing a received signal with a phase-locked loop (PLL);
   generating a carrier frequency offset estimate as a function of a phase error signal of the PLL; and
   detecting a false lock condition as a function of comparing the carrier frequency offset estimate to a closed loop value of the PLL.

2. The method of claim 1, wherein the processing step includes the step of setting the PLL in an open loop mode of operation.

3. The method of claim 1, wherein the generating step includes the steps of:
   determining a rollover count value for the phase error signal;
   determining a symbol count value of the received signal; and
   generating the carrier frequency offset estimate from the determined rollover count value and determined symbol count value.

4. The method of claim 1, further comprising the step of updating the PLL with the carrier frequency offset estimate.

5. A receiver comprising:
   a carrier tracking loop (CTL) for processing a received signal; and
   a processor for estimating a carrier frequency offset as a function of a phase error signal of the CTL;
   wherein the processor detects a false lock condition as a function of comparing the estimate of the carrier frequency offset to a closed loop value of the CTL.

6. The receiver of claim 5, wherein the CTL includes a rollover counter and a symbol counter accessible by the processor for use in estimating the carrier frequency offset.

7. The receiver of claim 5, wherein the receiver is a set-top box.

* * * * *